(12) United States Patent
Kaneda

(10) Patent No.: US 7,875,468 B2
(45) Date of Patent: Jan. 25, 2011

(54) BODY TO BE PLATED, METHOD OF DETERMINING PLATED FILM THICKNESS, AND METHOD OF MANUFACTURING SEMICONDUCTOR DEVICE

(75) Inventor: Yoshiharu Kaneda, Shiga (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/457,571

(22) Filed: Jun. 16, 2009

(65) Prior Publication Data
US 2009/0309200 A1    Dec. 17, 2009

(30) Foreign Application Priority Data
Jun. 17, 2008    (JP)    ............................ 2008-157403

(51) Int. Cl.
*H01L 21/00* (2006.01)
*H01L 21/66* (2006.01)
*H01L 21/50* (2006.01)
*H01R 43/00* (2006.01)

(52) U.S. Cl. ............................. 438/5; 438/15; 438/123; 29/825

(58) Field of Classification Search ...................... None
See application file for complete search history.

(56) References Cited

FOREIGN PATENT DOCUMENTS

JP    56-083936    7/1981

*Primary Examiner*—Scott B Geyer
(74) *Attorney, Agent, or Firm*—Foley & Lardner LLP

(57) ABSTRACT

A structure to be plated includes a body to be plated 11 on which plating is formed, and plated film thickness determining member 16 opposed to and electrically isolated from the body to be plated 11 through a slit portion 12. The plated film thickness determining member 16 has an islands-shape and is conductive. It is possible to instantly determine whether or not the plating formed on the body to be plated 11 has been formed to a thickness larger than the width W of the slit portion 12 on the spot by determining whether or not plating has grown from the surface of the body to be plated 11 to the plated film thickness determining member 16 through the slit portion 21.

10 Claims, 11 Drawing Sheets

BODY TO BE PLATED, METHOD OF DETERMINING PLATED FILM THICKNESS, AND METHOD OF MANUFACTURING SEMICONDUCTOR DEVICE

BACKGROUND

1. Field of the Invention

The present invention relates to a body to be plated having a structure to determine whether or not the film thickness of plating formed on the body to be plated is within a specification, a method of determining a plated film thickness, and a method of manufacturing a semiconductor device.

2. Description of Related Art

Plated film thicknesses are occasionally measured in inspection processes for bodies to be plated to which plating is applied. In semiconductor devices, for example, exterior plating (e.g., solder plating) is applied in order to facilitate mounting lead terminals on substrates. In exterior plating, it is necessary to obtain proper film thicknesses (hereinafter called "plating thicknesses") and proper composition (e.g., Sn and Bi) in order to ensure the mounting quality. Therefore, electrical currents flowing to electrodes and plating liquids in which semiconductor devices are submerged and the likes are carefully controlled in plating operations. However, when plating operations continue, process conditions of the currents and the plating liquids begin to fluctuate, and consequently causing a problem that the plating thicknesses and the composition become unsuitable.

FIG. 10 shows a typical flow for a manufacturing process of semiconductor devices in the related art. Firstly, dicing is carried out on a wafer to separate it into semiconductor chips (S1). After a separated semiconductor chip is mounted on a body to be plated, die-bonding is carried out (S2). Then, the electrode pads of the semiconductor chip are connected to lead terminals formed in the body to be plated by wire-bonding (S3). The semiconductor chip is sealed with resin (S4), and exterior plating is applied to lead portions exposed from the sealing resin in a plating process (S5). A serial number and the like are marked on the sealing resin (S6). After removing the frame of the body to be plated, which connects the lead terminals with each other, lead formation/cutting and the like are carried out (S7). After a finishing process, sorting is carried out according to the external appearance (S8) and the characteristics and the likes (S9), and the manufacturing of the semiconductor device is completed with an inspection process (S10)

In this process flow, the thickness of plating formed around lead terminals is measured in the inspection process (S10). A method using a fluorescent X-ray film thickness meter has becomes widespread as a method of measuring a plating thickness. However, measurement of a plating thickness using a fluorescent X-ray film thickness meter requires a long measurement time. Therefore, inspections for plating thicknesses have been carried out by controlling the currents and the liquid composition as well as temperature to fixed values as described above and by verifying actual plating thicknesses by sampling inspections that are carried out for each batch of plating or at regular intervals.

Furthermore, although it is not exterior plating for lead frames, Japanese Unexamined Patent Application Publication No. 56-083936 (Patent document 1) discloses a method of measuring a plated film thickness in a manufacturing process in which a Schottky barrier diode is formed by forming plating on a semiconductor substrate. As shown in FIG. 11, a protection film 91 composed of insulating material has been formed on a semiconductor substrate 90. The protection film 91 has a monitoring opening 92 formed therein, and a plated film 93 is formed inside the monitoring opening 92. It should be noted that the thickness of the plated film 93 is larger in an area close to the protection film 91 (bulging portion) and is smaller in the central area distant from the protection film 91 (hollow portion). Note also that when the plated film 93 is viewed from the top, it is observed that the bulging portion has a circular shape (diameter d) that is concentric with the monitoring opening (diameter D). The diameter d of this concentric circle is measured, and the ratio of the diameter d of this concentric circle to the diameter D of the monitoring opening, i.e., ratio d/D is calculated. Then, as shown in FIG. 12, the film thickness of the plated film 93 is measured based on the d/D, i.e., the ratio of the diameter d of the concentric circle to the diameter D of the monitoring opening.

SUMMARY

The present inventors have found a problem that a measurement method for a plated film thickness using a fluorescent X-ray film thickness meter requires a long measurement time. Therefore, if the frequency of inspections and the number of items to be inspected are increased in order to implement more elaborate management on the plating process, the inspection process becomes more complicated, and thus deteriorating the production efficiency. Furthermore, the measurement method for a plated film thickness using a fluorescent X-ray film thickness meter also requires separately-installed additional inspection machinery.

Furthermore, the method of measuring a plating thickness disclosed in Patent document 1 cannot measure the ratio d/D, i.e., the ratio of the diameter d of the concentric circle to the diameter D of the monitoring opening unless the protection film 91 is formed in the periphery of the plated film 93. In the exterior plating for lead frames, for example, plating is formed on the entire surface of a body to be plated and no protection film is formed. Therefore, the method of measuring a plating thickness disclosed in Patent document 1 cannot measure the plating thickness of a body to be plated on which no protection film is formed.

A first exemplary aspect of an embodiment of the present invention is a structure to be plated including: a body to be plated on which plating is formed; and a plated film thickness determining member opposed to and electrically isolated from the body to be plated through a slit portion, the plated film thickness determining member having an islands-shape and being conductive.

By forming a plated film thickness determining member that is electrically isolated from a body to be plated in a manner described above, it becomes possible to determine whether or not plating has grown from the surface of the body to be plated to the plated film thickness determining member through the slit portion. Therefore, it is possible to instantly determine whether or not the plating formed on the body to be plated has been formed to a thickness larger than the width of the slit portion on the spot.

A second exemplary aspect of an embodiment of the present invention is a method of determining a plated film thickness using a plated film thickness determining member opposed to and electrically isolated from a body to be plated on which plating is formed through a slit portion, the plated film thickness determining member having an islands-shape and being conductive, the method of determining a plated film thickness including measuring a plated film thickness by determining whether or not plating deposited on a surface of the body to be plated has reached the plated film thickness determining member through the slit portion.

By determining whether or not the plating deposited on the surface of the body to be plated has reached the plated film thickness determining member through the slit portion in a manner described above, it is possible to instantly determine whether or not the plating has been formed to a thickness larger than the width of the slit portion on the spot.

A third exemplary aspect of an embodiment of the present invention is a method of manufacturing a semiconductor device, including: mounting a semiconductor chip on a lead frame; sealing the semiconductor chip with insulating material; forming a slit portion in the lead frame; applying exterior plating to the lead frame on which the semiconductor chip is mounted; and inspecting a film thickness of the plating by determining whether or not plating is deposited on the slit portion.

By determining whether or not plating is deposited on the slit portion, it is possible to instantly inspect the plated film thickness with a simple method.

In accordance with an exemplary aspect of the present invention, it is possible to instantly determine the thickness of plating formed on a body to be plated on the spot. Furthermore, in accordance with an exemplary aspect of the present invention, a plating managing process can be implemented in an easy but elaborate manner even when the frequency of inspections and the number of items to be inspected are increased.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Figure 1:
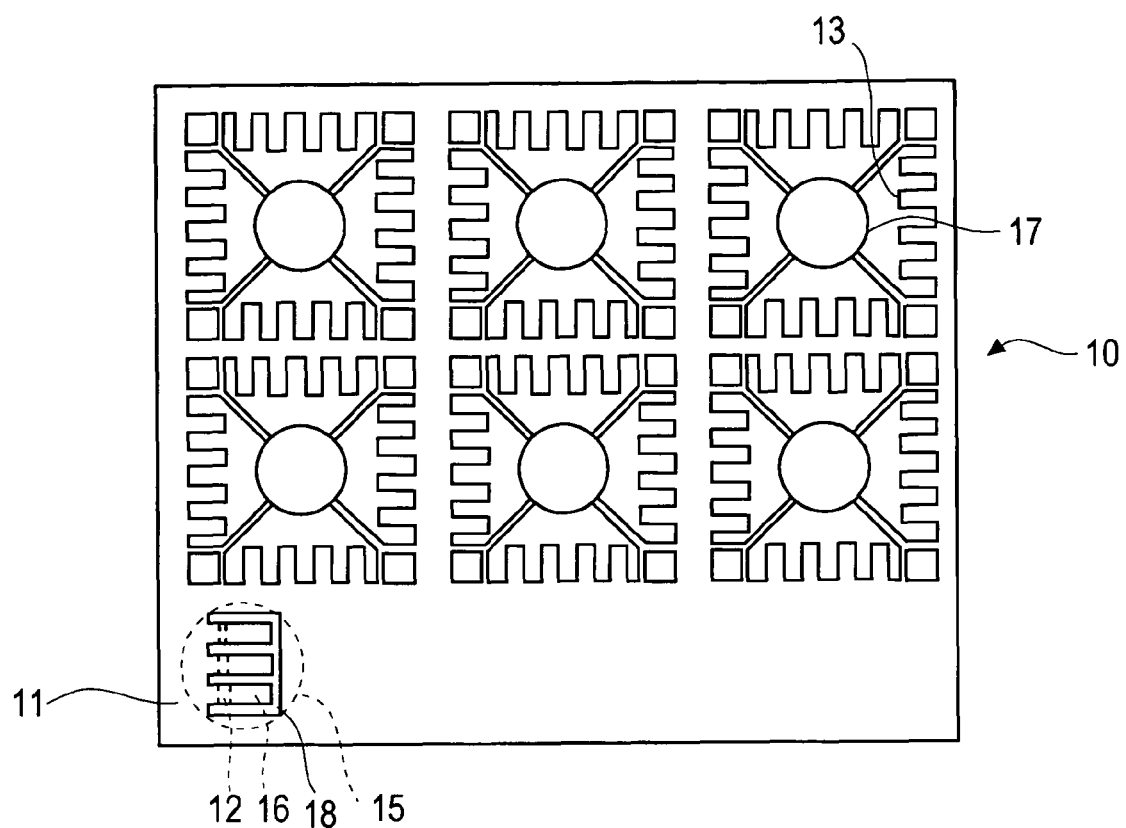
FIG. 1 is a plane view illustrating an example of an overall structure of a structure to be plated in accordance with an exemplary embodiment of the present invention.

Exemplary embodiments of the present invention are explained hereinafter with the attached drawings. FIG. 1 is a plane view illustrating an example of an overall structure of a structure to be plated in accordance with an exemplary embodiment of the present invention. A structure to be plated 10 includes a body to be plated 11 on which plating is formed, and plated film thickness determining member 16 opposed to and electrically isolated from the body to be plated 11 through a slit portion 12. The plated film thickness determining member 16 has an islands-shape and is conductive. The structure to be plated 10 is assumed to be a lead frame in the following explanation for the sake of explanation. However, it should be noted that the structure to be plated 10 may be any object provided that plating can be formed on that.

Semiconductor chips will be mounted in array on the structure to be plated 10. Chip mounting portions 17 on each of which a semiconductor chip is mounted are formed in the structure to be plated 10. Further, a plurality of lead terminals 13 that are arranged so as to surround each chip mounting portion 17 are also formed in the structure to be plated 10. The lead terminals 13 are disposed at positions corresponding to the external electrodes of the semiconductor chip. The plurality of lead terminals 13 are formed at predefined intervals, and connected with the frame at their peripheries.

A plated film thickness determining portion 15 that is used to measure the film thickness of plating formed in a plating process is formed in the periphery of an area where semiconductor chips are mounted. The plated film thickness determining portion 15 has plated film thickness determining members 16. The plated film thickness determining members 16 are opposed to and electrically isolated from the frame, which connects the lead terminals 13 with each other, through a slit portion 12. The overall structure to be plated except for the plated film thickness determining members 16 is referred to as "structure to be plated 10" in the following explanation.

Figure 2:
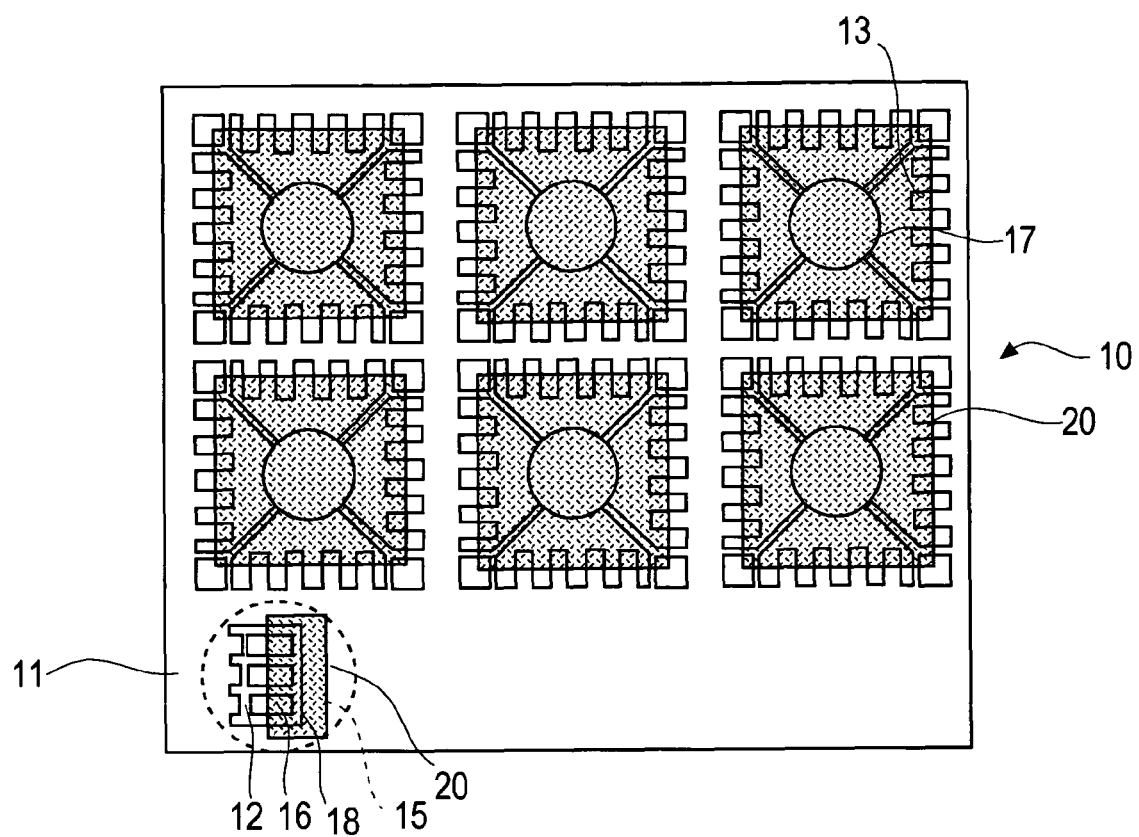
FIG. 2 is a plane view illustrating a state where molded resin is formed on a structure to be plated in accordance with an exemplary embodiment of the present invention.

FIG. 2 is a plane view illustrating a state where molded resin is formed on a structure to be plated in accordance with an exemplary embodiment of the present invention. A semiconductor chip (not shown) is mounted on each chip mounting portion 17 in the structure to be plated 10. The external electrodes of the semiconductor chips mounted on the structure to be plated 10 are connected to the lead terminals 13 by wires (not shown). An insulating member 20 is formed so as to cover a semiconductor chip in a state where the semiconductor chip and the lead terminals 13 are connected by wires. The insulating member 20 is formed for each semiconductor chip. Furthermore, the insulating member is also formed on part of the plated film thickness determining portion 15. The insulating member 20 is composed, for example, of molded resin.

Figure 3:
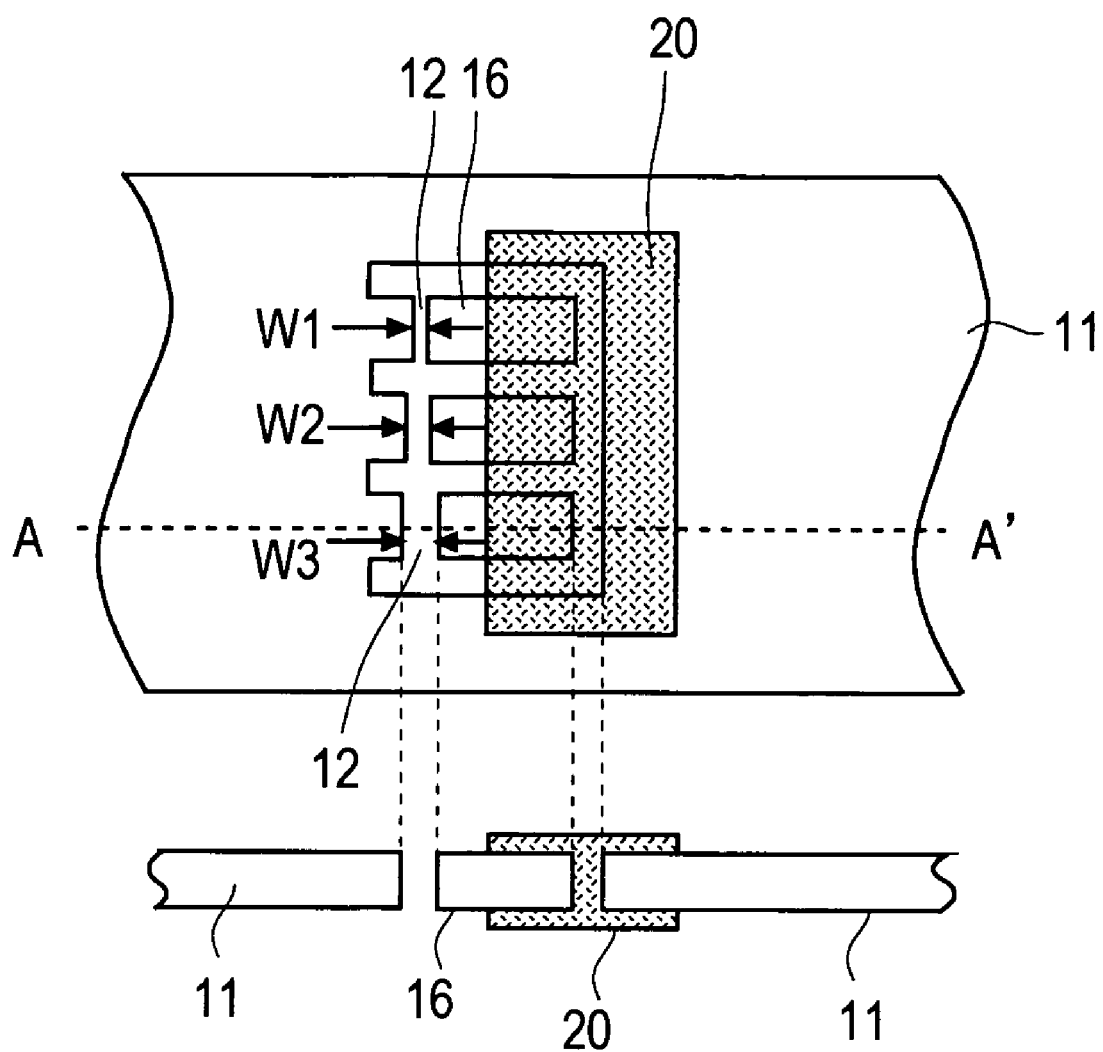
FIG. 3 is a plane view illustrating a detailed structure of a plated film thickness determining portion of a structure to be plated in accordance with an exemplary embodiment of the present invention, and its cross section taken along a line A-A'.

Next, details of the plated film thickness determining portion 15 are explained hereinafter. FIG. 3 is a plane view illustrating a detailed structure of a plated film thickness determining portion of a structure to be body in accordance with an exemplary embodiment of the present invention, and its cross section taken along a line A-A'. A U-shaped slot 18a is formed in an edge portion of the structure to be plated 10. In other words, the slot 18a is formed so as to surround the plated film thickness determining members 16. Two rectangular slots 18b are formed at predefined intervals in such a manner that they divide the area surrounded by the U-shaped slot into three sections. In this way, three plated film thickness determining members 16 are formed inside the U-shaped slot 18a. Note that the number of the plated film thickness determining members 16 is not limited to three, and any given number of plated film thickness determining members 16 may be formed depending on the plating thickness to be determined.

Slit portions 12 that are used to isolate the plated film thickness determining members 16 from the body to be plated 11 are formed on the inner side than the opened end of the U-shaped slot 18a. In other words, the slit portions 12 are formed so as to cut apart the connecting portions of the neighboring plated film thickness determining members 16. The slit portions 12 are formed so as to correspond to their respective three plated film thickness determining members 16, and the three widths of the slit portions 12 are different from one another. Assume that the widths of the uppermost slit portion 12, the middle slit portion 12, and the lowermost slit portion 12 in the figure are W1, W2, and W3 respectively. The widths of the uppermost slit portion 12, the middle slit portion 12, and the lowermost slit portion 12 in the figure are 10 μm, 15 μm, and 20 μm respectively.

The widths W1-W3 of the slit portions 12 may be established according to a predefined plating specification. An insulating member 20 that connects the plated film thickness determining members 16 with the frame of the body to be plated 11 is formed in the opposite ends of the plated film thickness determining members 16 with respect to the slit portions 12. This insulating member 20 is produced by the same manufacturing process as that for the molded resin formed over the semiconductor chips.

As illustrated in the cross section shown in FIG. 3, the insulating member 20 is formed so as to physically connect the plated film thickness determining members 16 with the body to be plated 11. Since the insulating member 20 has an insulating property, the plated film thickness determining members 16 are electrically insulated from the body to be plated 11 while they are physically connected by the insulating member 20. Furthermore, the plated film thickness determining members 16 themselves are also electrically insulated from each other while they are physically connected with each other. The plated film thickness determining members 16 are located so as to oppose to the body to be plated 11 through the slit portion 12.

Figure 4A:
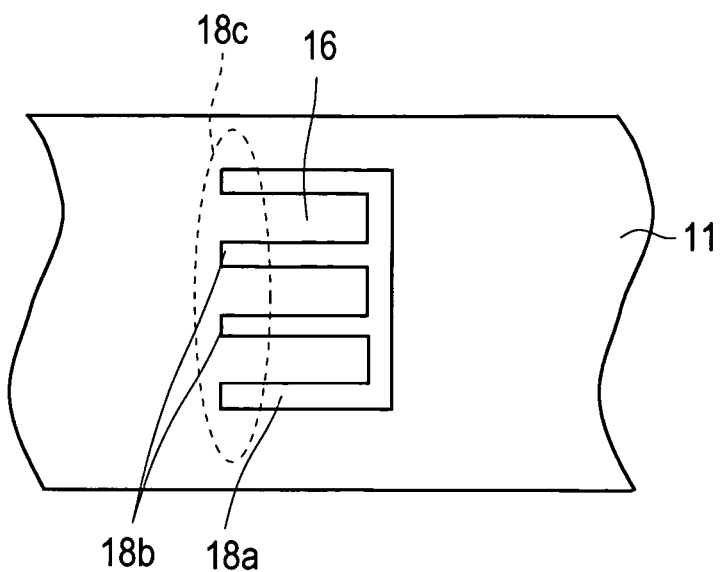
FIGS. 4A to 4C are plane views illustrating a manufacturing process of a plated film thickness determining portion of a structure to be plated in accordance with an exemplary embodiment of the present invention.
Figure 4B:
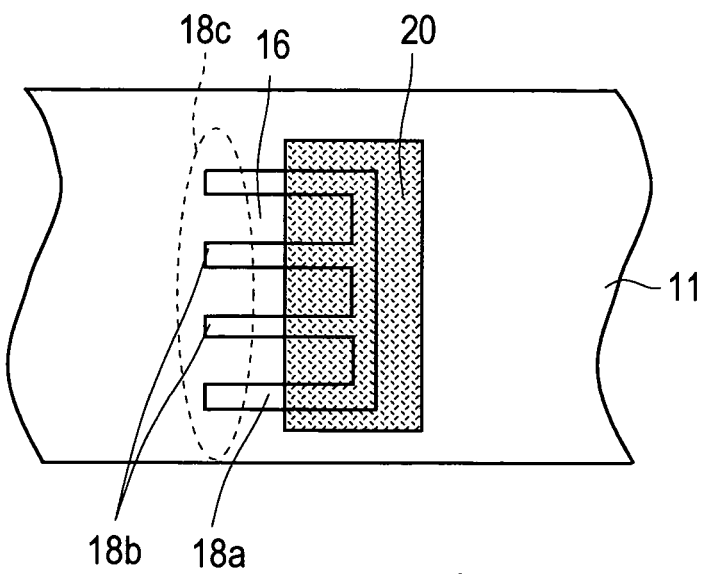
Figure 4C:
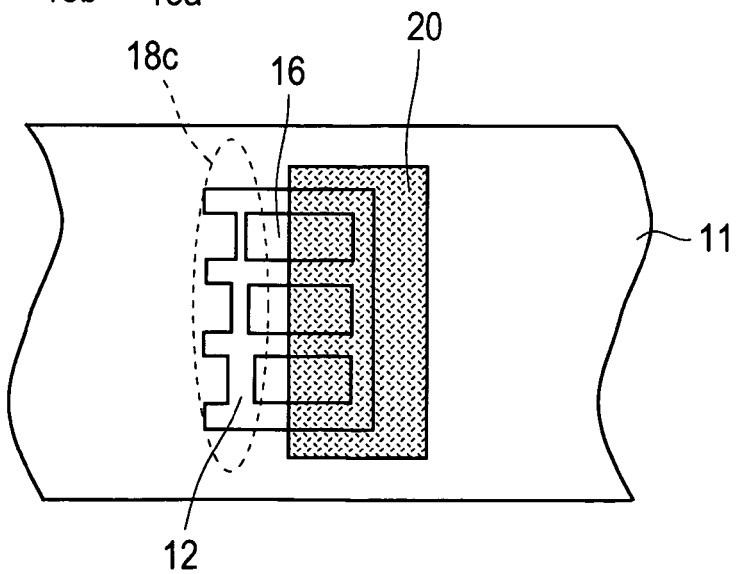

FIGS. 4A to 4C are plane views illustrating a manufacturing process of plated film thickness determining portions having a structure described above. As shown in FIG. 4A, firstly, a U-shaped slot 18a and rectangular slots 18b that divide the area surrounded by the U-shaped slot are formed in the structure to be plated 10. The slots 18a and 18b are formed, for example, by patterning, and may be formed by the same process as that for the lead terminals 13. The plated film thickness determining members 16, which were divided by the slots 18b, are connected with each other at the opened end of the U-shaped slot 18a (fixed end 18c).

Next, as shown in FIG. 4B, an insulating member 20 is formed such a manner that the opposite ends of the plated film thickness determining members 16 with respect to the fixed end 18c are physically connected to part of the body to be plated 11 that oppose to these ends. In this way, the opposite ends of the plated film thickness determining members 16 to the fixed end 18c are fixed and connected to the body to be plated 11. Then, as shown in FIG. 4C, the fixed end 18c of the U-shaped slot 18a that connects the plated film thickness determining members 16 with each other is cut off by laser irradiation. In this manner, slit portions 12 are formed, so that the plated film thickness determining members 16 is separated from the body to be plated 11.

Next, a method of determining a plated film thickness in a body to be plated having a structure described above is explained hereinafter. FIGS. 5A to 5D are cross sections illustrating transitions in a plating process of a structure to be plated. Note that the cross sections shown FIGS. 5A to 5D correspond to a section taken along the line A-A' in FIG. 3.

Figure 5A:
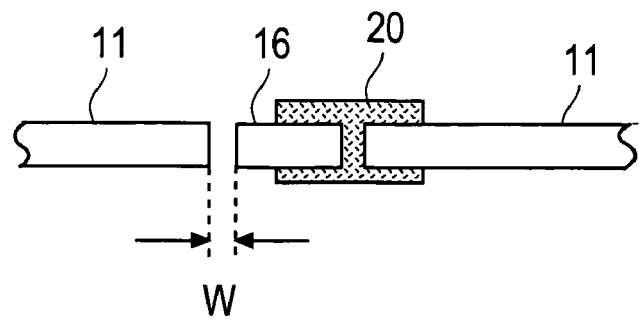
FIGS. 5A to 5D are cross sections illustrating transitions in a plating process of a structure to be plated in accordance with an exemplary embodiment of the present invention.

As shown in FIG. 5A, the body to be plated 11 and the plated film thickness determining members 16 are electrically isolated from each other and spaced apart by a predefined distance before exterior plating is applied. Next, plating is formed on the surface of the body to be plated 11 by feeding an electrical current through the body to be plated 11 in a state where the structure to be plated 10 is entirely submerged in a plating liquid.

Figure 5B:
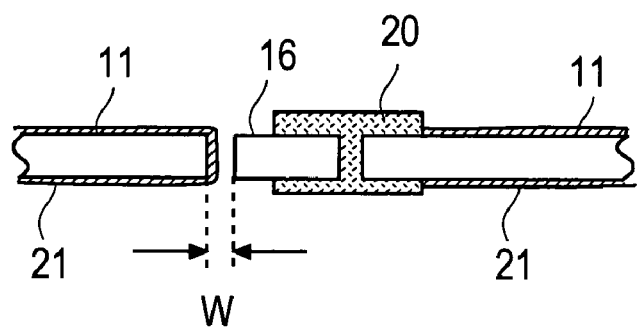

As shown in FIG. 5B, plating is deposited only on the body to be plated 11 that is in conduction at the early stage of the plating process. The plated film thickness determining member 16, which is electrically isolated from the body to be plated 11, is not in conduction, and therefore no plating 21 is deposited on them. As described above, no plating 21 is deposited on the plated film thickness determining member 16, and a color change, which would occur by the deposition of the plating 21, does not occur in the plated film thickness determining member 16 in the early stage of the plating process.

Figure 5C:
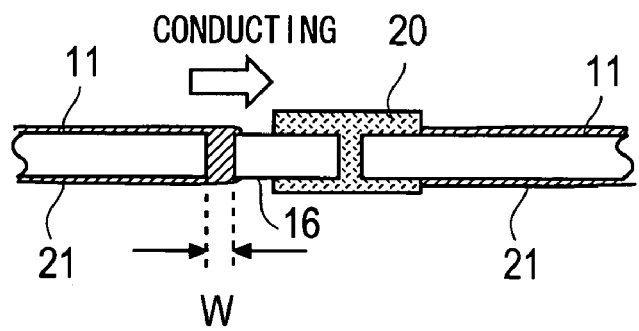

As shown in FIG. 5C, as the deposition of the plating on the surface of the body to be plated 11 has advanced, the plating 21 begins to deposit on the plated film thickness determining member 16 through the slit portion 12. In this way, the plated film thickness determining member 16 is connected to the body to be plated 11 through the plating 21 and brought into conduction, and therefore the plating 21 also starts to deposit on the plated film thickness determining member 16.

Figure 5D:
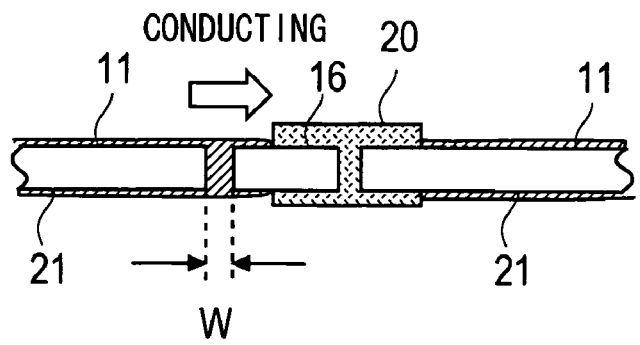

As shown in FIG. 5D, when the deposition of the plating 21 has advanced further, the plating 21 is formed so as to cover the surface of the plated film thickness determining member 16. By determining the state of the plated film thickness determining member 16 that changes according to the deposition of the plating 21 in this manner, it is possible to determine whether or not the thickness of the plating 21 deposited on the body to be plated 11 is larger than the slit width W.

Next, a method of determining the film thickness on a body to be plated in accordance with an exemplary embodiment of the present invention is explained hereinafter. FIGS. 6A, 6B, 7A and 7B show a method of determining a plated film thickness on a body to be plated. In an inspection process that is carried out after the plating process is completed, the film thickness of plating 21 is measured by observing the plated film thickness determining member 16. That is, the film thickness of plating 21 is measured by determining whether or not the plating 21 is formed on three plated film thickness determining members 16 formed in the plated film thickness determining portion 15. For example, it is possible to determine whether or not the plating 21 is formed on the plated film thickness determining members 16 by observing the color of the plated film thickness determining members 16 with human eyes. Alternatively, it is also possible to determine whether or not the plating 21 is formed on the plated film thickness determining members 16 by measuring the reflectivity of the plated film thickness determining members 16.

As shown in FIG. 16A, if the plating 21 is not formed on any of three plated film thickness determining members 16 in the inspection process, it is found out that the plating 21 has not grown to the slit width W1=10 μm. Therefore, it is determined that the thickness of the plating 21 formed on the surface of the plating 21 is less than or equal to 10 μm.

Figure 6A:
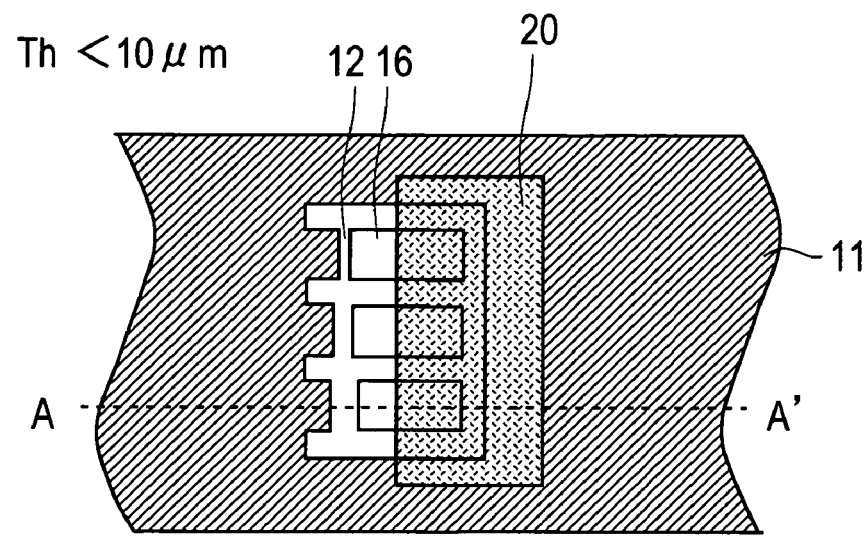
FIGS. 6A and 6B show a method of determining a film thickness of a structure to be plated in accordance with an exemplary embodiment of the present invention.
Figure 6B:
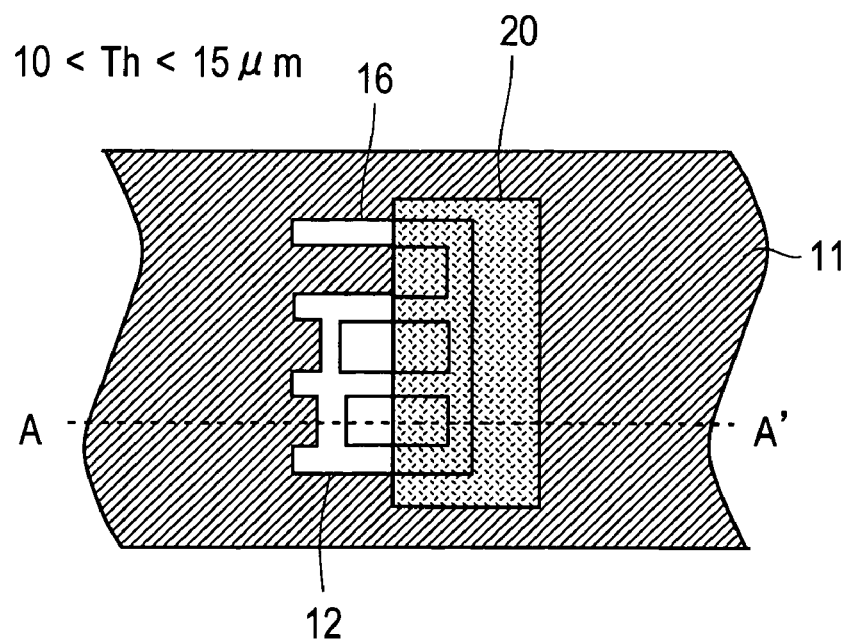

As shown in FIG. 6B, if the plating 21 is formed on the plated film thickness determining member 16 corresponding to the slit width W1=10 μm but is not formed on the plated film thickness determining members 16 corresponding to the slit widths W2=15 μm and W3=20 μm, it is found out that the thickness of the formed plating 21 is larger than the slit width W1=10 μm but smaller the slit width W2=15 μm.

Figure 7A:
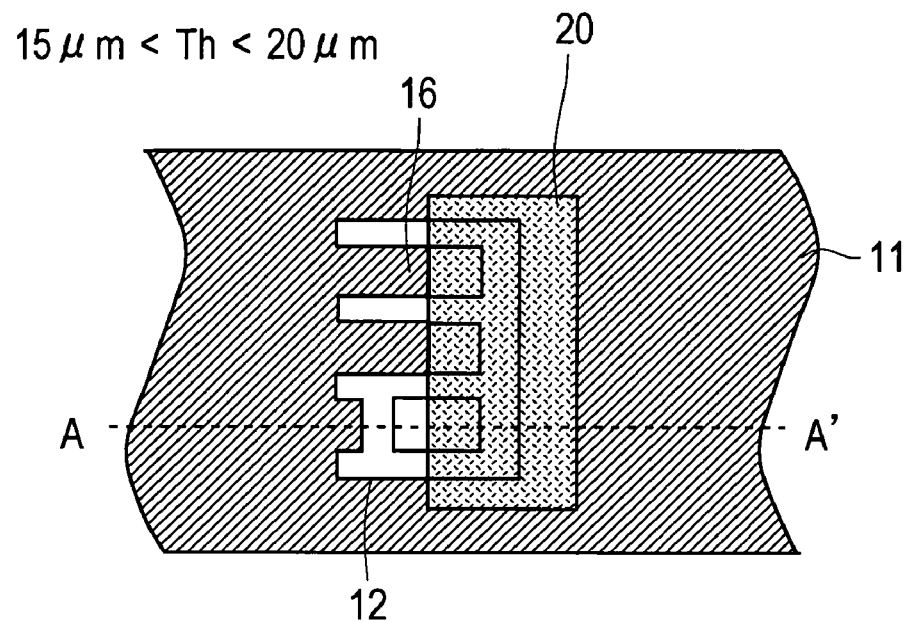
FIGS. 7A and 7B show a method of determining a film thickness of a structure to be plated in accordance with an exemplary embodiment of the present invention.

As shown in FIG. 7A, if the plating 21 is formed on the plated film thickness determining members 16 corresponding to the slit widths W1=10 μm and W2=15 μm but is not formed on the plated film thickness determining member 16 corresponding to the slit width W3=20 μm, it is found out that the thickness of the formed plating 21 is larger than the slit width W2=15 μm but smaller than the slit width W3=20 μm.

Figure 7B:
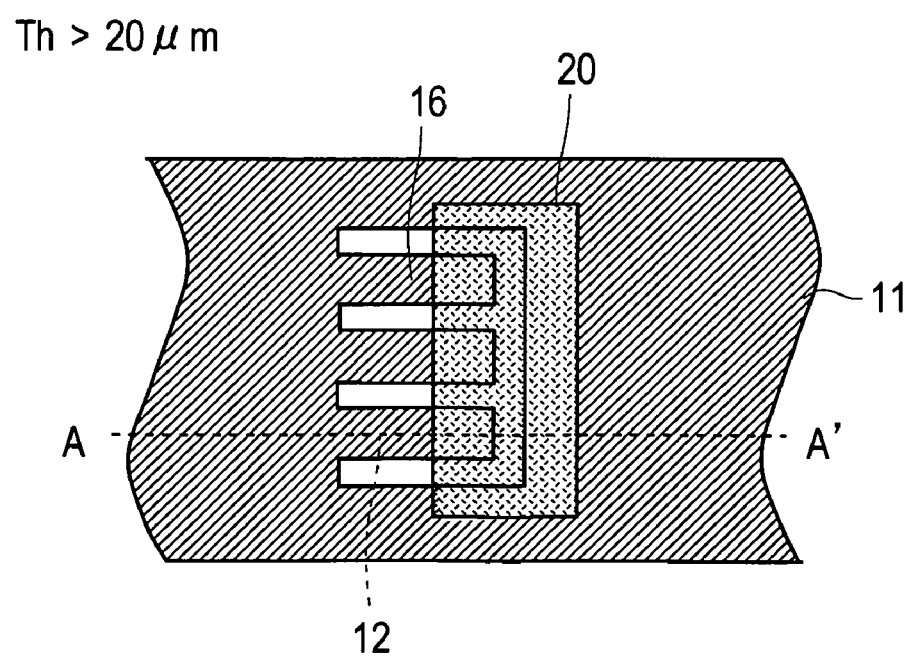

As shown in FIG. 7B, if the plating 21 is formed on all three plated film thickness determining members 16, it is found out that the thickness of the formed plating 21 is larger than the slit width W3=20 μm. In this manner, it is possible to classify the thickness of the plating 21 into four levels composed of levels less than or equal to 10 μm, between 10 to 15 μm, between 15 to 20 μm, and greater than or equal to 20 μm by determining whether or not the plating 21 is formed on three plated film thickness determining members 16. By determining whether the plating 21 is formed or not in a manner described above, it is possible to determine whether or not the thickness of the plating 21 is within a predefined specification.

Figure 8:
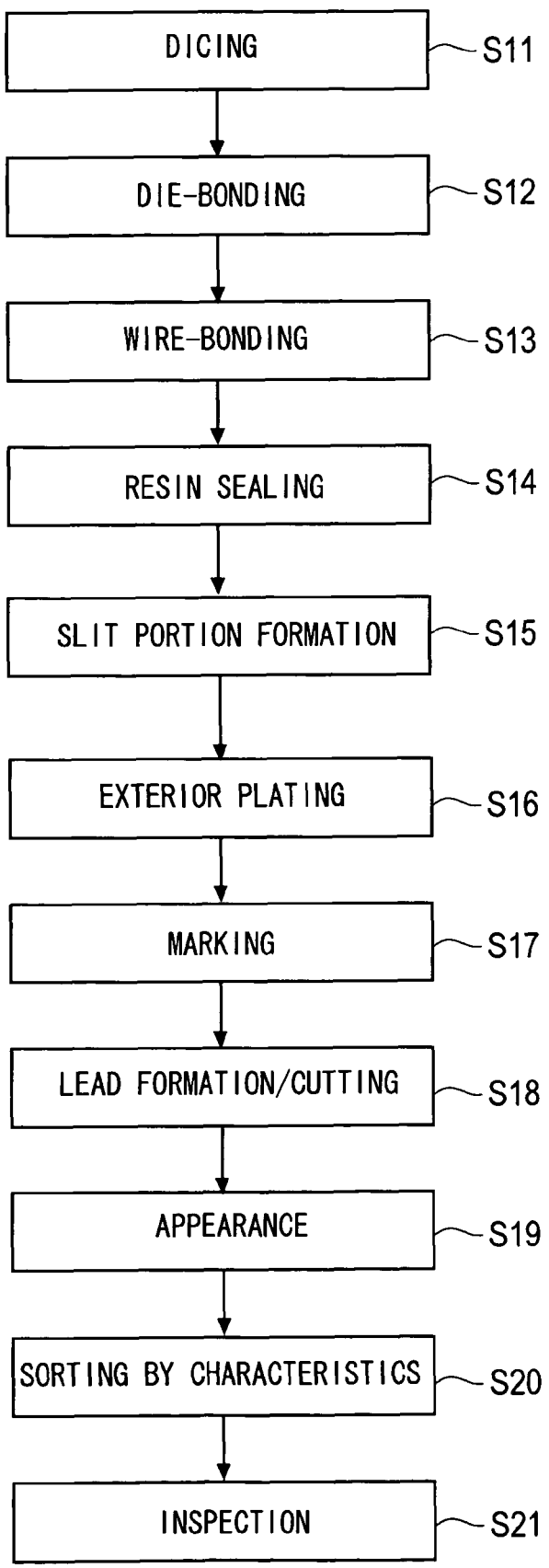
FIG. 8 is a flowchart illustrating a method of manufacturing a semiconductor device equipped with a structure to be plated in accordance with an exemplary embodiment of the present invention.

FIG. 8 is a flowchart illustrating a method of manufacturing a semiconductor device equipped with a body to be plated in accordance with an exemplary embodiment of the present invention. Firstly, dicing is carried out on a wafer to separate it into semiconductor chips (S11). After a separated semiconductor chip is mounted on a structure to be plated 10, die-bonding is carried out (S12). Then, electrode pads of the semiconductor chip are connected to lead terminals formed in the body to be plated 11 by wire-bonding (S13). The semiconductor chip is sealed with resin, and the opened end of the plated film thickness determining member 16 is connected to the body to be plated 11 by this resin (S14). Then, the fixed end 18c of the plated film thickness determining member 16 is removed by laser irradiation in order to form a slit portion 12 (S15).

Exterior plating is applied to lead portions exposed from the sealing resin in a plating process (S16). A serial number and the like are marked on the sealing resin (S17). Lead formation/cutting and the like are carried out by removing the frame of the structure to be plated 10, which connects the lead terminals 13 with each other (S18). After a finishing process, sorting is carried out according to the external appearance (S19) and the characteristics and the likes (S20). Then, the film thickness of the plating 21 is determined using a method described with FIGS. 6A, 6B, 7A and 7B in an inspection process (S20).

In a body to be plated that is formed in a manner described above, an approximate plating thickness can be verified by external appearance without requiring expensive and large-scale machinery such as a fluorescent X-ray film thickness meter in the measurement of the plating thickness, and thereby enabling to swiftly obtain appropriate conditions for the plating operation. Furthermore, it is possible to instantly determine whether or not a plating thickness is within a specification on the spot simply by determining whether or not the plating 21 is formed on the plated film thickness determining member 16.

It should be noted that an inspection of lead frames is usually performed in a batch in the related art, and a spot check is carried out on a single lead frame that is arbitrary picked out from each batch by using a fluorescent X-ray film thickness meter. When the evaluation result relating to plating, such as a film thickness, of this single lead frame is determined to be acceptable in the spot check, the entire batch is also determined to be acceptable (good) and the process proceeds to the next stage (marking). Accordingly, in the inspection method in the related art, it is merely estimation that the plating thicknesses may satisfy the specification for all the products in the batch except for the one that is picked up and accurately measure by the fluorescent X-ray film thickness meter. Therefore, it is impossible to accurately determine whether or not the film thicknesses of these remaining products are within the specification.

By contrast, since it is easily determined whether a plating thickness is within a specification or not by simply observing external appearance with human eyes or by using a simple recognition device capable of determining the color of the plating on the plated film thickness determining member 16 in this exemplary embodiment of the present invention, the pass/fail on the plating thicknesses of all the lead frames in a batch can be easily determined.

Note that if the only decision that needs to be made is whether the plating thickness is within a certain specification, e.g., whether the plating thickness is within a range of 10-15 μm, the only requirement is to form two slits, i.e., a slit to detect 10 μm and a slit to detect 15 μm.

Furthermore, the plated film thickness determining portion 15 may be provided in part of the entire structure to be plated 10, or a structure to be plated 10 in which nothing but a plated film thickness determining portion 15 is provided may be introduced as appropriate between bodies to be plated that are to be processed in a row. That is, a structures to be plated 10 that is dedicatedly used to determine a film thickness and provided with nothing but a plated film thickness determining portion 15 is manufactured and introduced one after another between other ordinary bodies to be plated having no plated film thickness determining portion 15 in the plating device, so that the film thicknesses of these bodies to be plated having no plated film thickness determining portion 15 can be measured by using this structure to be plated 10. In this manner, the use of such a structure to be plated 10 can eliminate the necessity for providing a plated film thickness determining portion 15 in each of the other bodies to be plated, and thereby eliminating the restriction on the frame area. In such a case, for example, when a defect is detected on a certain structure to be plated 10, the determination may be made such that bodies to be plated including the one immediately before the structure to be plated 10 should be considered as possibly having a defect.

Figure 9A:
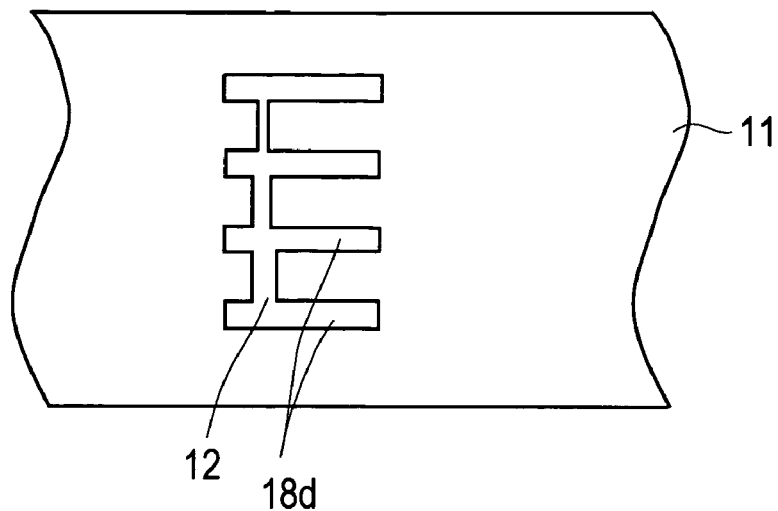
FIGS. 9A and 9B are plane views illustrating another method of manufacturing a plated film thickness determining portion of a structure to be plated in accordance with an exemplary embodiment of the present invention.
Figure 9B:
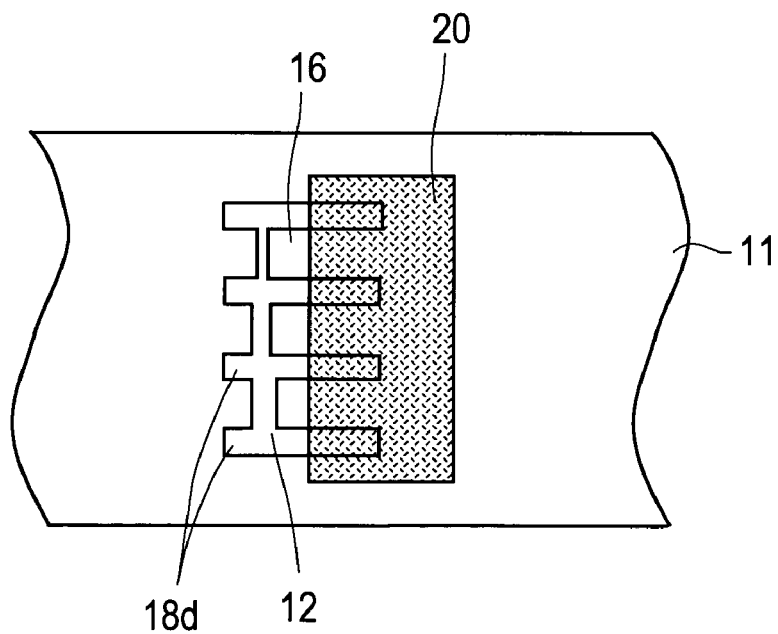
Figure 10:
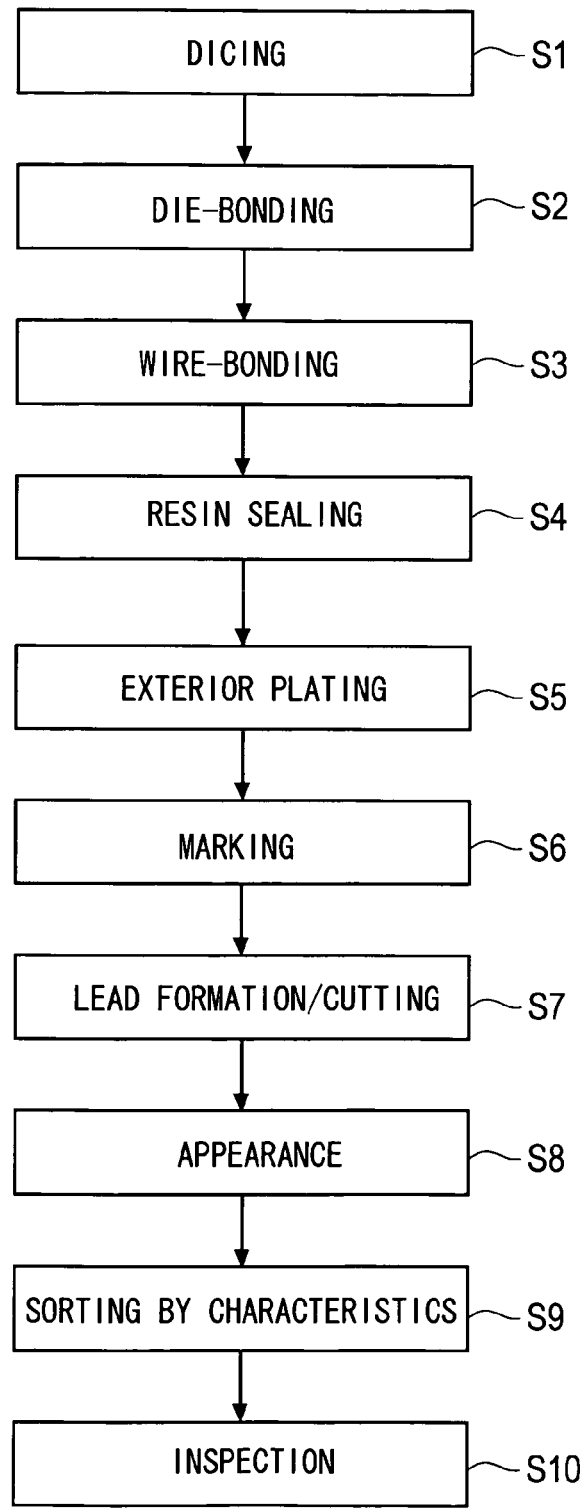
FIG. 10 is a flowchart illustrating a method of manufacturing a semiconductor device in the related art.
Figure 11:
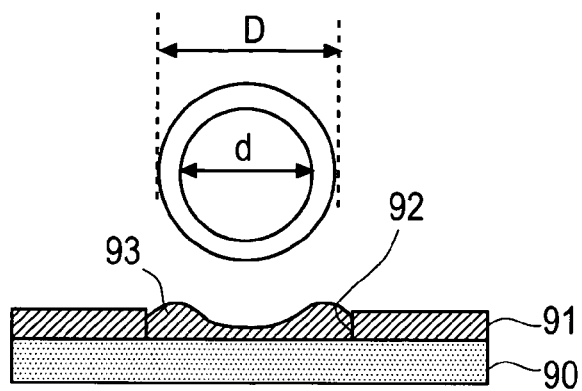
FIG. 11 shows a method of measuring a plating thickness of a semiconductor device disclosed in Patent document 1.
Figure 12:
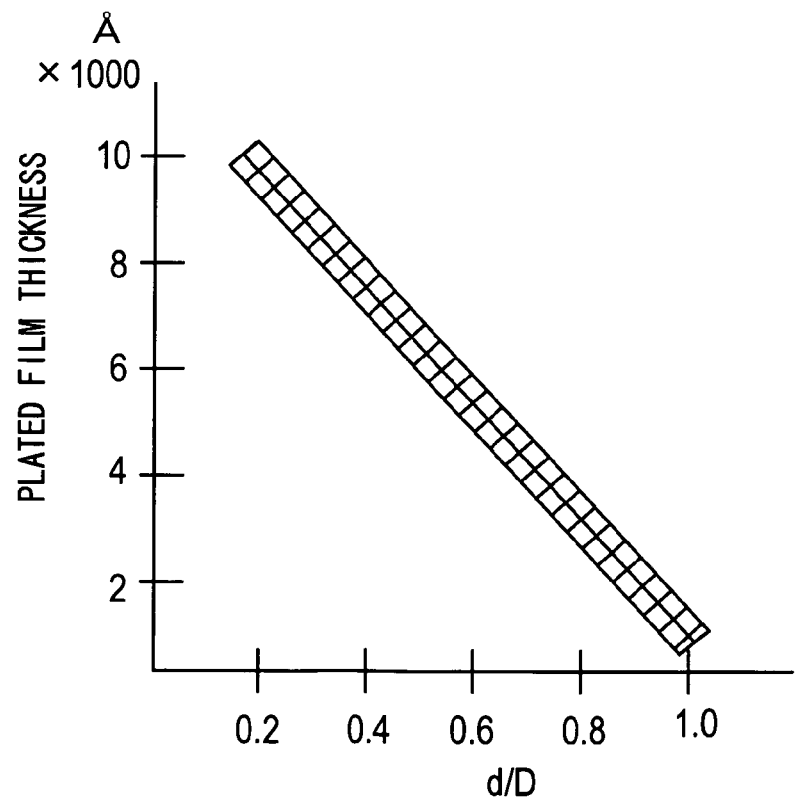
FIG. 12 shows a relation between the ratio of the diameter d of a concentric circle to the diameter D of a monitoring opening, i.e., ratio d/D, and plating thickness disclosed in Patent document 1.

FIGS. 9A and 9B are plane views illustrating another method of manufacturing a plated film thickness determining portion of a structure to be plated in accordance with an exemplary embodiment of the present invention. As shown in FIG. 9A, slots 18d and slit portions 12 are formed on a body to be plated 11, for example, by the same process as that for forming the lead terminals 13 (not shown). Several slots 18d are formed at predefined intervals, and each of them extends in the lateral directions in the figure. Several slits 12 are also formed so as to cut through between adjacent slots 18d. As in the case of an exemplary embodiment described with FIGS. 4A to 4C, the widths d of the slots 18d are different from one another.

Next, as shown in FIG. 9B, an insulating member 20 is formed such a manner that it is spaced from the slit portions 12 by a certain distance and covers the right end of the slots 18d in the figure. In this way, plated film thickness determining members 16 that are electrically isolated from the body to be plated 11 are formed. In a structure to be plated that is formed in a manner described above, the slit portions 12 can be formed by the same process as that for forming the lead terminals 13. Therefore, the plated film thickness determining members 16 can be formed with a simpler structure by a simpler manufacturing process in comparison with the exemplary embodiment shown in FIGS. 4A to 4C. As shown in FIGS. 9A and 9B, the formation process of the slit portions 12 may be carried out after the insulating member 20 is formed. That is, this exemplary embodiment of the present invention can achieve advantageous effects of the present invention regardless of its shape and manufacturing process provided that a plated film thickness determining member 16 that is electrically isolated from the body to be plated 11 can be formed.

Note that the present invention is not limited to the above-described exemplary embodiments, and various modifications may be made to them without departing from the scope of the present invention.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above. Further, the scope of the claims is not limited by the exemplary embodiments described above.

Furthermore, it is noted that, Applicant's intent is to encompass equivalents of all claim elements, even if amended later during prosecution.

What is claimed is:

1. A method of determining a plated film thickness using a plated film thickness determining member opposed to and electrically isolated from a body to be plated on which plating is formed through a slit portion, the plated film thickness determining member having an islands-shape and being conductive,
the method of determining a plated film thickness comprising measuring a plated film thickness by determining whether or not plating deposited on a surface of the body to be plated has reached the plated film thickness determining member through the slit portion.

2. The method of determining a plated film thickness according to claim 1, wherein whether or not the plating has reached the plated film thickness determining member through the slit portion is determined by determining a color of the plated film thickness determining member.

3. The method of determining a plated film thickness according to claim 1, wherein whether or not the plating has reached the plated film thickness determining member through the slit portion is determined by measuring reflectivity of the plated film thickness determining member.

4. The method of determining a plated film thickness according to claim 1, wherein the body to be plated is a lead frame.

5. A method of manufacturing a semiconductor device, comprising:
mounting a semiconductor chip and forming a slit portion in a lead frame, the semiconductor chip being sealed with insulating material;
applying exterior plating to the lead frame on which the semiconductor chip is mounted; and
inspecting a film thickness of the plating by determining whether or not plating is deposited on the slit portion.

6. The method of manufacturing a semiconductor device according to claim 5, further comprising:
forming a slit portion so that a plated film thickness determining member is opposed to and electrically isolated from a lead frame on which plating is formed through the slit portion, the plated film thickness determining member having an islands-shape and being conductive, and
measuring a plated film thickness by determining whether or not plating deposited on a surface of the body to be plated has reached the plated film thickness determining member through the slit portion.

7. The method of manufacturing a semiconductor device according to claim 6, wherein the plated film thickness determining member and the lead frame is connected by insulating material.

8. The method of manufacturing a semiconductor device according to claim 7, wherein the insulating material connecting the plated film thickness determining member with the lead frame is formed by the same process as the insulating material sealing the semiconductor chip.

9. The method of manufacturing a semiconductor device according to claim 6, wherein whether or not the plating has reached the plated film thickness determining member through the slit portion is determined by determining a color of the plated film thickness determining member.

10. The method of manufacturing a semiconductor device according to claim 6, wherein whether or not the plating has reached the plated film thickness determining member through the slit portion is determined by measuring reflectivity of the plated film thickness determining member.

* * * * *